United States Patent
Chen et al.

(10) Patent No.: US 12,255,675 B2
(45) Date of Patent: Mar. 18, 2025

(54) SIMULTANEOUS BI-DIRECTIONAL HYBRID TRANSCEIVER FOR SINGLE-ENDED VOLTAGE MODE SIGNALING

(71) Applicant: NVIDIA Corp., Santa Clara, CA (US)

(72) Inventors: Xi Chen, Milpitas, CA (US); Yoshinori Nishi, San Jose, CA (US); John Poulton, Chapel Hill, NC (US)

(73) Assignee: NVIDIA Corp.

( * ) Notice: Subject to any disclaimer, the term of this patent is extended or adjusted under 35 U.S.C. 154(b) by 388 days.

(21) Appl. No.: 17/931,472

(22) Filed: Sep. 12, 2022

(65) Prior Publication Data

US 2023/0246661 A1 Aug. 3, 2023

Related U.S. Application Data

(60) Provisional application No. 63/304,456, filed on Jan. 28, 2022.

(51) Int. Cl.
  *H04B 1/04* (2006.01)
  *H03H 7/38* (2006.01)
  *H04B 1/38* (2015.01)

(52) U.S. Cl.
  CPC ............ *H04B 1/0483* (2013.01); *H03H 7/38* (2013.01); *H04B 1/38* (2013.01)

(58) Field of Classification Search
  CPC .......... H04B 1/0483; H04B 1/38; H03H 7/38
  See application file for complete search history.

(56) References Cited

U.S. PATENT DOCUMENTS

| | | | | |
|---|---|---|---|---|
| 10,840,892 | B1* | 11/2020 | Rengarajan | H03K 3/35625 |
| 2005/0030820 | A1* | 2/2005 | Choi | G11C 7/1057 |
| | | | | 365/232 |
| 2012/0002573 | A1* | 1/2012 | Ceekala | H04L 5/1461 |
| | | | | 370/276 |

OTHER PUBLICATIONS

Yang Hang Fan et al, A 32-GB/s Simultaneous Bidirectional Source-Synchronous Transceiver With Adaptive Echo Cancellation Techniques, IEEE Journal of Solid-State Circuits, vol. 55, No. 2, Feb. 2020, pp. 439-451.

Yasumoto Tomita, A 20-GB/s Simultaneous Bidirectional Transceiver Using a Resistor-Transconductor Hybrid in 0.11 CMOS, IEEE Journal of Solid-State Circuits, vol. 42, No. 3, Mar. 2007, pp. 627-636.

* cited by examiner

*Primary Examiner* — Christopher M Brandt
(74) *Attorney, Agent, or Firm* — Carnelian Law

(57) ABSTRACT

A simultaneous bi-directional (SBD) transceiver includes a main transmit driver, a replica transmit driver, and a series-series-bridged (SSB) tri-impedance network. A pre-driver stage includes parallel delay paths for the main transmit driver and the replica transmit driver, enabling the delay for signals received by the main transmit driver and the replica transmit driver to be independently configured.

26 Claims, 7 Drawing Sheets

SIMULTANEOUS BI-DIRECTIONAL HYBRID TRANSCEIVER FOR SINGLE-ENDED VOLTAGE MODE SIGNALING

CROSS REFERENCE TO RELATED APPLICATIONS

This application claims priority and benefit under 35 USC 119 to U.S. application No. 63/302,456, filed on Jan. 28, 2022, the contents of which are incorporated herein by reference in their entirety.

BACKGROUND

Modern circuit interconnects utilize high-frequency transceivers operating at tens of gigabits per second (Gb/s) per pin. The power budget (constraint on energy consumption) for such circuits typically does not scale with operational frequency.

Single-ended voltage-mode signaling technology may be utilized to meet the constraints of such implementations. One such example is CMOS Inverter-based Short Reach (ISR) signaling. Some such implementations, for example non-return-to-zero (NRZ) signaling, may incur unacceptably high power and noise overhead at data rates around or exceeding 32 Gb/s.

Another possible solution is pulse amplitude modulation with greater than two voltage levels (e.g., PAM4), but such solutions are often characterized by challenging signal-to-noise ratios (SNR) and system complexity.

Techniques utilizing simultaneous bi-directional (SBD) signaling generates bidirectional signal flows over a single channel to effectively double the bandwidth per channel, at the same Nyquist frequency as NRZ signaling approaches without the commensurate power and timing overhead.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 6B illustrates an aspect of the subject matter in accordance with one embodiment.

DETAILED DESCRIPTION

Figure 1:
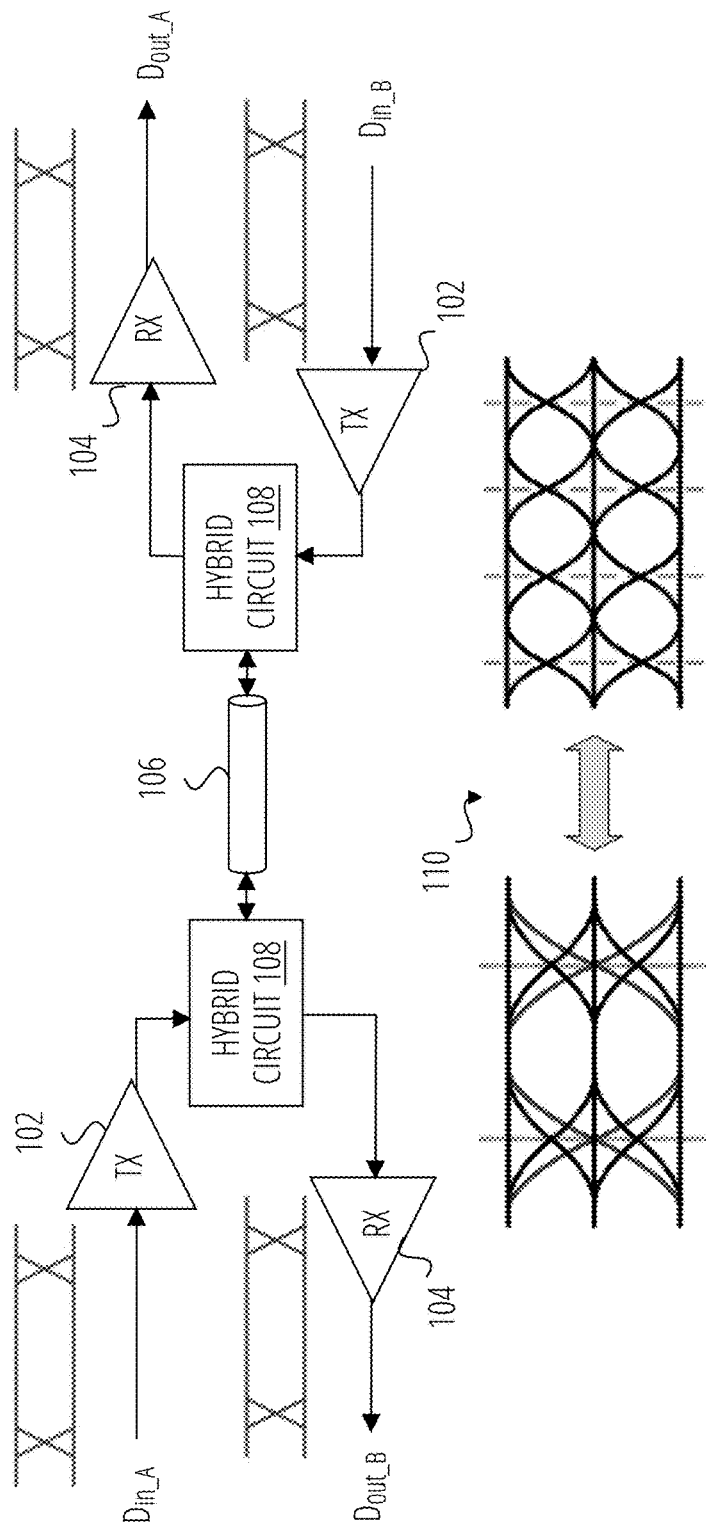
FIG. 1 depicts a circuit architecture for a simultaneous bidirectional link.

FIG. 1 depicts the structure of an SBD channel. Transmitter 102 and receiver 104 stages at each end of the communication channel 106 are operated simultaneously. A hybrid circuit 108 stage is utilized to subtract outbound signals from inbound signals to recover signals at the receivers 104. There's no strict requirement that signaling frequencies in both directions be equal, although this is often the case. The eye diagrams 110 in FIG. 1 depicts situations in which bi-directional signals at both ends of the communication channel 106 are synchronous and are 1) in-phase (left diagram), and 2) have a quadrate-phase relationship (right diagram).

Figure 2A:
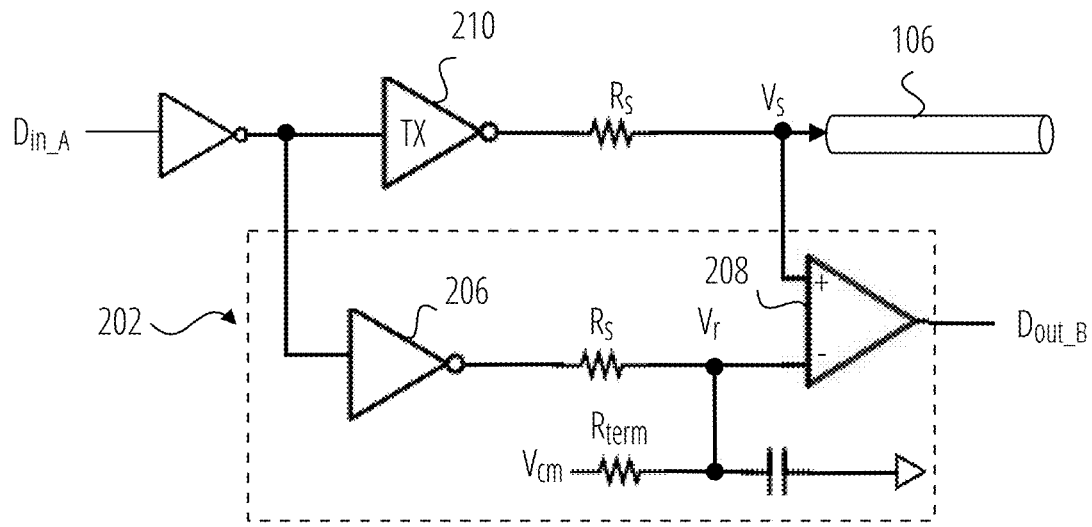
FIG. 2A depicts a replica-based SBD hybrid circuit 202.
Figure 2B:
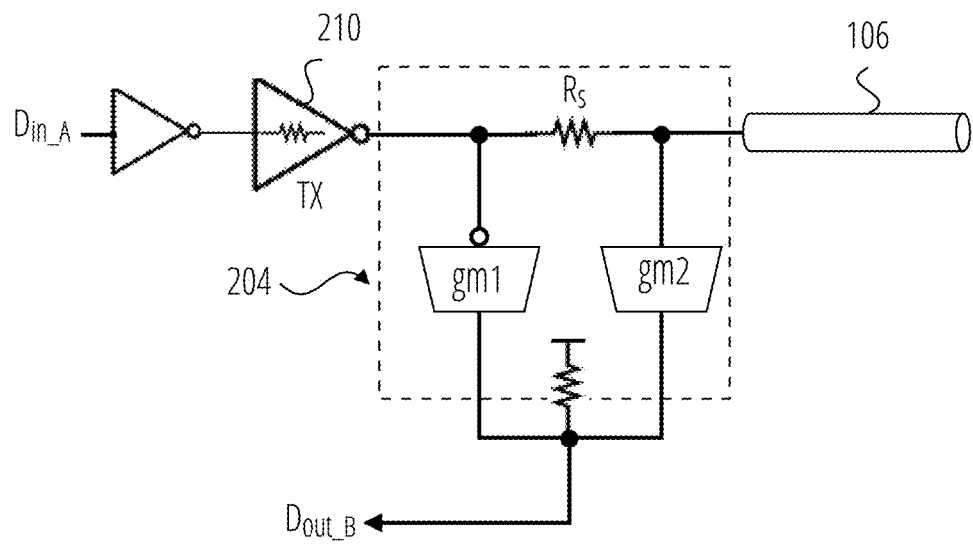
FIG. 2B depicts an R-gm-based hybrid circuit 204.

FIG. 2A depicts an embodiment of a replica-based SBD hybrid circuit 202. FIG. 2B depicts an embodiment of an R-gm-based hybrid circuit 204, R refers to the series termination resistor $R_s$ and gm refers to the transconductance elements (gm1 and gm2), wherein one of these elements is inverting to implement a subtraction of outgoing from incoming signal. In these embodiments, and in SBD signaling more generally, voltage and current from two directions are mixed on the communication channel 106.

The replica-based SBD hybrid circuit 202 utilizes a replica driver 206 and a high-accuracy analog subtraction circuit 208 to fully subtract the transmitted signal. For matching purpose, the replica-based SBD hybrid circuit 202 utilizes resistive ($R_{term}$) and capacitive (depicted capacitor) terminations to emulate the channel loading, as well as the common-mode bias generation to replicate the voltage condition on the communication channel. It may also be desirable to employ a smaller size replica driver 206 than the main transmit driver 210 to save power, but this puts more demands on the subtraction circuit 208.

The R-gm-based hybrid circuit 204 extracts both in-bound and out-bound signals from the transmit driver 210 through the voltage drop across the series termination resistor ($R_s$), and thus avoids the use of a replica driver circuit and the need for common mode bias generation. The gm1 and gm2 circuits operate at opposite polarity to implement signal subtraction, and require high linearity. This is one reason why the R-gm-based hybrid circuit 204 may be suitable for differential, small-signal interfaces, but implementing it with single-ended, large signal voltage-mode interfaces may be impractical.

Figure 3A:
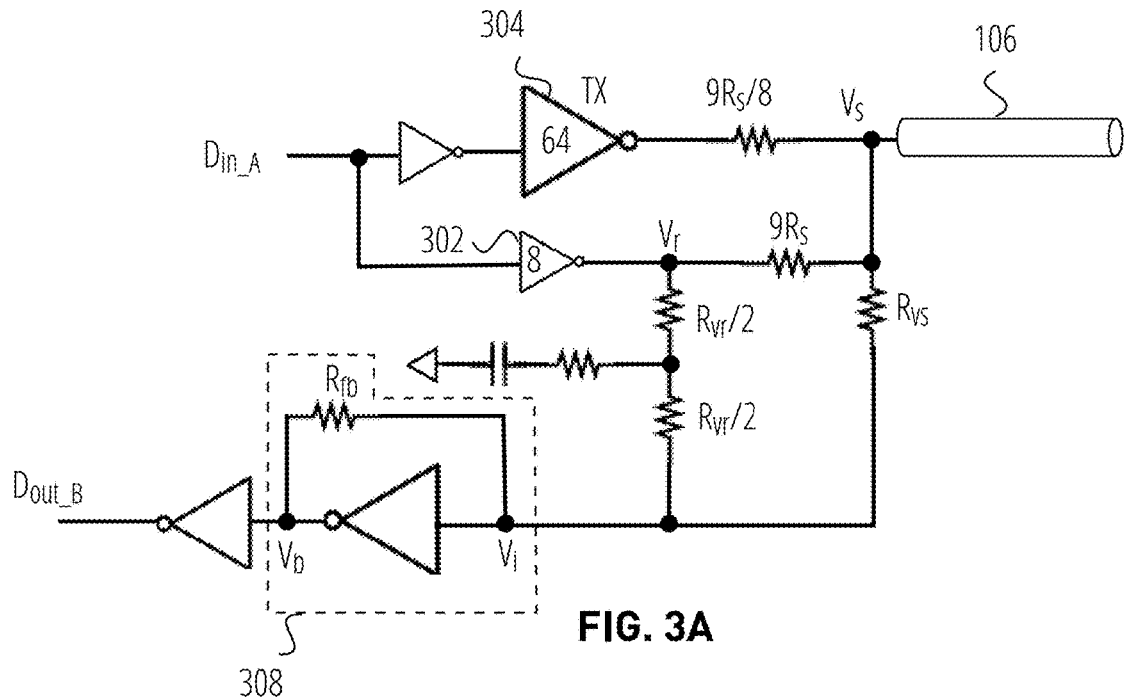
FIG. 3A depicts a single-ended hybrid circuit in one embodiment.
Figure 3B:
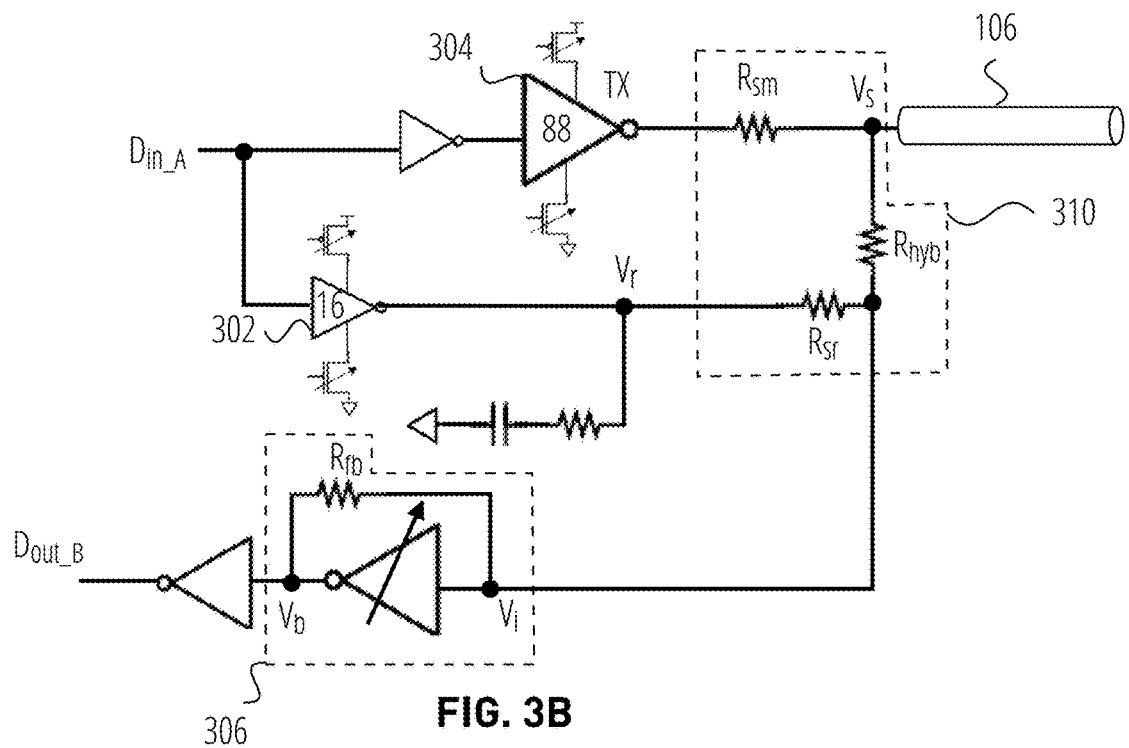
FIG. 3B depicts a single-ended hybrid circuit in another, more compact embodiment.

FIG. 3A depicts a single-ended hybrid circuit in one embodiment. FIG. 3B depicts a single-ended hybrid circuit in another, more compact embodiment. In the embodiment of FIG. 3A, the resistances (Rvs, Rvr) perform an analog subtraction function. With appropriate resistance ratio, the inbound signal is recovered at node ($V_i$). The trans-impedance amplifier 308 converts the current mode output from the resistor network back into a voltage signal, with amplification gain. The trans-impedance amplifier 308 may comprise a self-biased CMOS inverter that facilitates recovery of the received signal to CMOS levels without utilizing additional common mode voltage. The $R_{vr}$ resistance is configurable, providing flexibility to define positive/negative path gain and the use of a smaller replica driver 302 (8X smaller than the transmit driver 304 in this example), saving area and power.

In these examples, exemplary values for $R_{sm}$, $R_{hyb}$, $R_{sr}$, and $R_{fb}$ are, respectively, 22.5 ohms, 180 ohms, 250 ohms, and 1200 ohms. An exemplary structure for the transmit driver 304 and replica driver 302. An exemplary structure for the trans-impedance amplifier 306 is similar but without the terminal (serial) resistor.

The output of the replica driver 302 is coupled to node ($V_s$) to obviate the dummy common mode bias. This also provides the replica driver 302 output at the pre-driving node ($V_r$) at ($V_s$) for higher swing and better power efficiency. To better match the channel loading at the transmit driver 304, a damping R-C network may be added (depicted between $R_{vr}/2$ resistances), but this is optional when channel capacitive loading is sufficiently low.

Signal inversion in the replica path implements signal subtraction at the summing node $V_i$. The resistances ($R_{vs}$, $R_{vr}$) implement a current subtraction function without dynamic range constraints. The trans-impedance amplifier 308 improves the linearity of the subtraction function determined by $R_{vs}$ and $R_{vr}$ by attenuating voltage swing at the $V_i$ node.

The resistive network utilized in the embodiment of FIG. 3A may be compactified to yield the embodiment of FIG. 3B. This specific configuration of three impedance effects— a series impedance between the transmit driver 304 and the communication channel 106, a series impedance between the replica driver 302 and the trans-impedance amplifier 306, and a bridging impedance between the communication channel 106 and the trans-impedance amplifier 306, is referred to herein as an SSB tri-impedance network 310 (series-series-bridged impedance network). In one specific embodiment the SSB tri-impedance network 310 is comprised of exactly three distinct resistors. More generally the impedances may be combinations of discrete resistive elements and impedances intrinsic in active components (e.g., transistors of the transmit driver 304 and/or replica driver 302) and/or passive components (e.g., wire runs). One characteristic of the SSB tri-impedance networks disclosed herein is that the three impedances cooperate the cancel out a transmitted signal from a total signal that includes a received signal, leaving a remainder comprising the received signal for amplification.

With appropriate ratio between resistances $R_{hyb}$ and $R_{sr}$, the hybrid networks of the two embodiments operate equivalently. Note also that the sizing ratio of the transmit driver 304 and replica driver 302 (88/16 i.e. 11:1 in this example) may be utilized to tune the operation of the circuit. More generally the ratios utilized may depend on many factors (signal swings, values of the resistors in the hybrid network, etc.). For example, ratios in the range of 5:1 to 20:1 may be utilized. The embodiment of FIG. 3B may be readily implemented as a source-serial termination (SST) driver structure. Both of the transmit driver 304 and the replica driver 302 comprise header and footer transistors for the purposes of electrostatic discharge, output impedance trimming cross process corners, P/N field effect transistor (FET) distortion trimming, and fine-tuning of the circuit's behavior.

Circuits in accordance with the depicted embodiments provide signal swing that is close to the full supply range without the linearity penalty incurred in traditional R-gm SBD designs. Such embodiments also provide greater power efficiency than conventional differential or current mode SBD implementations.

A communication channel configured to operate in SBD mode may also at times be operated in a uni-directional (UND) mode, in which only one side of the channel transmits signals at a time, and the other receives the transmitted signals. In UND mode the transmitter side of the channel may deactivate (power down) components of the replica path and receiver (including the trans-impedance amplifier) to save power. The idle transmitter at the receive end of a UND may continue to supply current at a fixed output state, either "1" or "0", in order to provide line termination. The receiver-side replica continues to operate, supplying the opposite value, in order to cancel the transmitter's output.

The receiver side of the channel may bias its termination at the common mode voltage level at the expense of some extra complexity as well as additional current (and hence power) consumption. Hence an alternative to this approach may be desired.

An alternative mechanism to implement receiver termination in UND mode is to configure the inputs at the main transmit driver and the replica driver of the receiver side of the channel to fixed values (e.g., logic low at the replica driver), and use the receiver end hybrid circuit to convert received signals to an operational trip point at the trans-impedance amplifier input. The receiver termination is dominated by the impedance of the main transmit driver. Therefore the total DC current generated by the receiver termination is lower than the current that would be generated by a termination biased at the common mode voltage (e.g., a Thevenin termination). This configuration is referred to herein as a "near-ground" setting in the UND mode.

When a near-ground setting is utilized, the signal received at node $V_s$ comprises a common mode voltage closer to ground than VDD/2 (half the supply voltage). This is due to the fact that the receiver side main transmit driver continually pulls the DC current at node $V_s$ to ground. The hybrid circuit on the receiver side recovers the signal common mode to ~VDD/2 at the node $V_i$ (the trans-impedance amplifier's input). The signal integrity performance of a near-ground terminated UND channel is comparable to that of a common mode biased termination.

The header and footer trimming transistors on the receiver side components may be utilized to fine-tune the signal common mode for desired duty-cycle performance. The near-ground UND configuration may be utilized in the forwarded clock lane when a UND mode clocking signal is adopted. Electrical migration effects may occur due to configuring the circuits with inputs at a constant polarity for extended periods. To mitigate this possibility, the polarity of the inputs to the main transmit driver and replica driver may be alternated between high and low each time the system initializes, to average out electrical migrations effects.

The main driver at the receiver end in UND mode serves as the receiver termination. When the receiver side driver is sending continuous "0"s in UND mode, it pulls the receiver common mode voltage below ½ VDD) and relatively near-ground. Alternatively, the receiver side driver may keep sending "1" in UND mode as a termination. In this case, the receiver common mode voltage will be above ½ VDD and relatively near-supply. This latter case is referred to herein as a "near-supply" configuration in UND mode.

We may use "a near-ground or near-supply configuration" here to be more completed.

The depicted embodiments utilize a pair of inverters in the main path (304), and a single inverter in the replica path (302). This may result in a signal propagation delay mismatch between the main path and the replica path. To address this possibility, a pass-gate may be added to the replica path, or one of the main and replica signals may be clocked through a flip-flop to remove the skew. Those of skill in the art will appreciate that there are many known mechanisms for matching the delay of signals on the main and replica paths.

Figure 4:
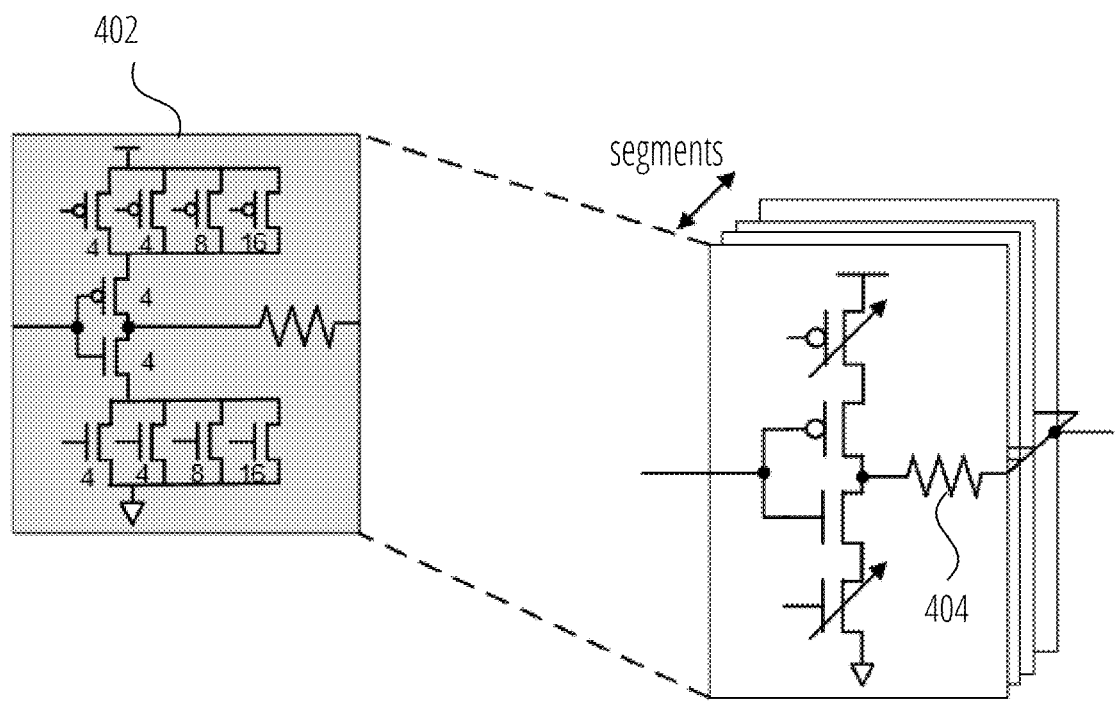
FIG. 4 depicts an exemplary transistor structure 402 that may be utilized to implement a transmit driver 304 and replica driver 302.

FIG. 4 depicts an exemplary transistor structure 402 that may be utilized to implement a transmit driver 304 and/or replica driver 302 for SBD signaling. The trans-impedance amplifier 306 may utilize a structure similar to that of FIG. 4, but without the termination resistor 404. Header and footer transistors may be added to provide for common mode trimming, especially for example when the communication channel 106 is operating between two oppositely distorted corner circuits.

In one embodiment, the basic structure of the transmit driver 304 and replica driver 302 are the same, except that the transmit driver 304 comprises more segments (e.g., 22 segments) for lower output impedance, whereas the replica driver 302 comprises fewer segments (e.g., 4 segments) to save power. Also, each segment of the transmit driver 304 may comprise a plurality (e.g., two) parallel titanium-nitride resistor ($R_m$) cells to implement an approximately ~500 ohm series termination, whereas each segment of the replica driver 302 may comprise fewer (e.g., one) $R_m$ cell to implement an approximately ~1000 ohm termination.

Figure 5:
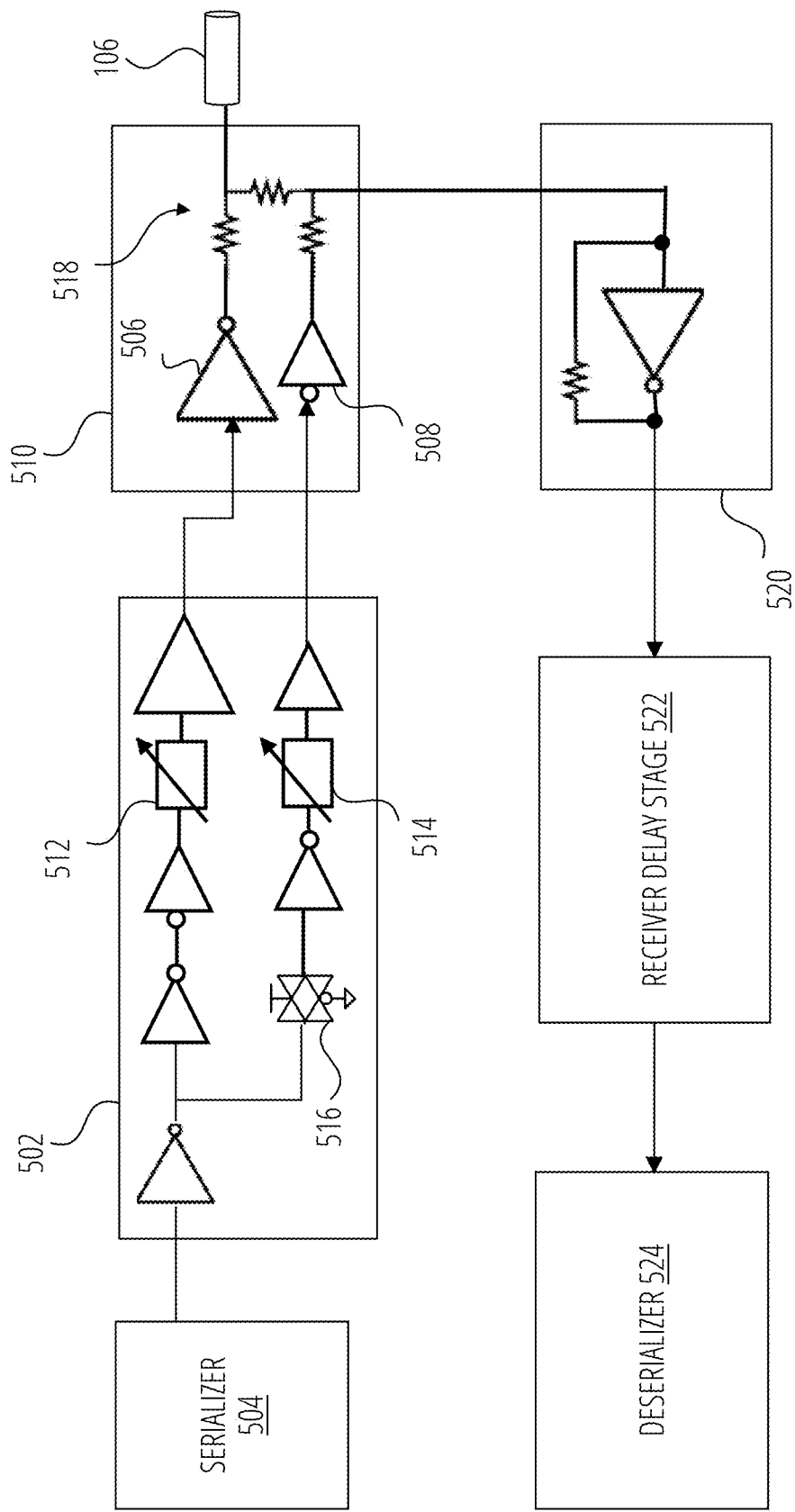
FIG. 5 depicts an SBD transceiver circuit in one embodiment.

FIG. 5 depicts an SBD transceiver circuit in one embodiment. A serializer 504 receives a multi-bit input signal in parallel, and converts it to serialized format to a pre-driver stage 502. The pre-driver stage 502 sets the relative timing of the serialized signal along a main path to the main transmit driver 506 and a replica path to the replica driver 508 in the driver and hybrid stage 510. The pre-driver stage 502 utilizes a configurable delay 512 on the main path and another configurable delay 514 on the replica path for this purpose. The pre-driver stage 502 also utilizes various drivers for buffering and other purposes known in the art. A pass gate 516 is disposed along the duplicate path to introduce non-inverting delay approximately equal to the first inverter in the upper path of the pre-driver stage 502.

The hybrid resistor network 518 performs the hybrid operations described previously. At the input of the receiver trans-impedance amplifier stage 520, the hybrid resistor network 518 distinguishes signals received from the communication channel 106 from signals being simultaneously transmitted. These signals pass the receiver trans-impedance amplifier stage 520 to the receiver delay stage 522 and are converted from serial to parallel form by the deserializer 524.

Figure 6A:
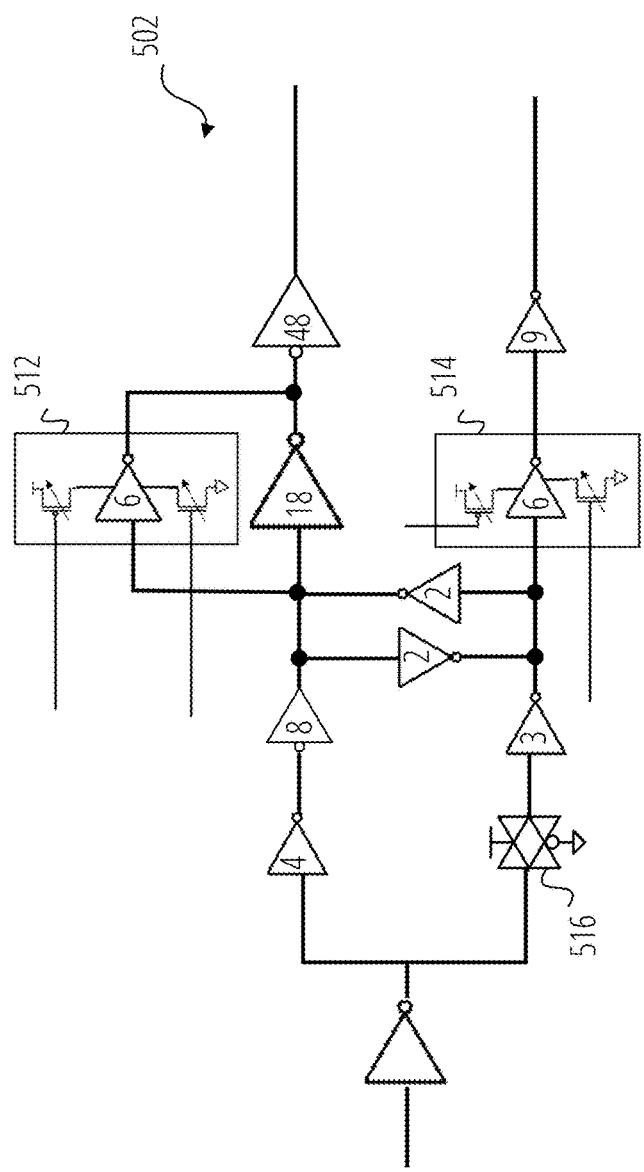
FIG. 6A and FIG. 6B depict a more detailed structure of the pre-driver stages 502 in one embodiment.
Figure 6B:
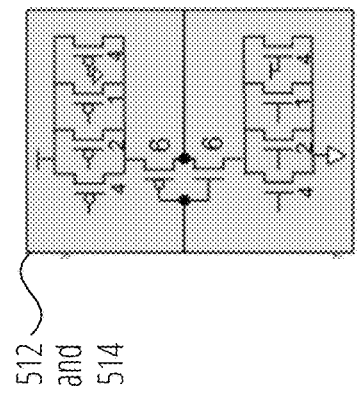

FIG. 6A and FIG. 6B depict a more detailed structure of the pre-driver stages 502 in one embodiment. Also depicted are exemplary component sizes. The pre-driver stages 502 establish signal strength to the driver and hybrid stage 510 with fan-out that meets requirements of the implementation. The pre-driver stage 502 also produces pseudo-differential signals from the single-ended output of the serializer 504. Yet another function of the pre-driver stage 502 is to provide delay matching between the main transmit driver 506 path and the replica driver 508 path, with tuning capability to cover variations (especially channel variation). A delay mismatch between the two paths will generate leakage in the hybrid resistor network, and it may be challenging to precisely predict delay mismatches caused by channel loading. Therefore, delay trimming (tuning) in the pre-drivers is desirable. Due to the different driving strengths between the paths, the configurable delay 514 in the replica path may be utilized for coarse delay tuning, while the main path configurable delay 512 with a parallel fixed-delay driver may provide delay tuning with higher resolution.

Figure 7:
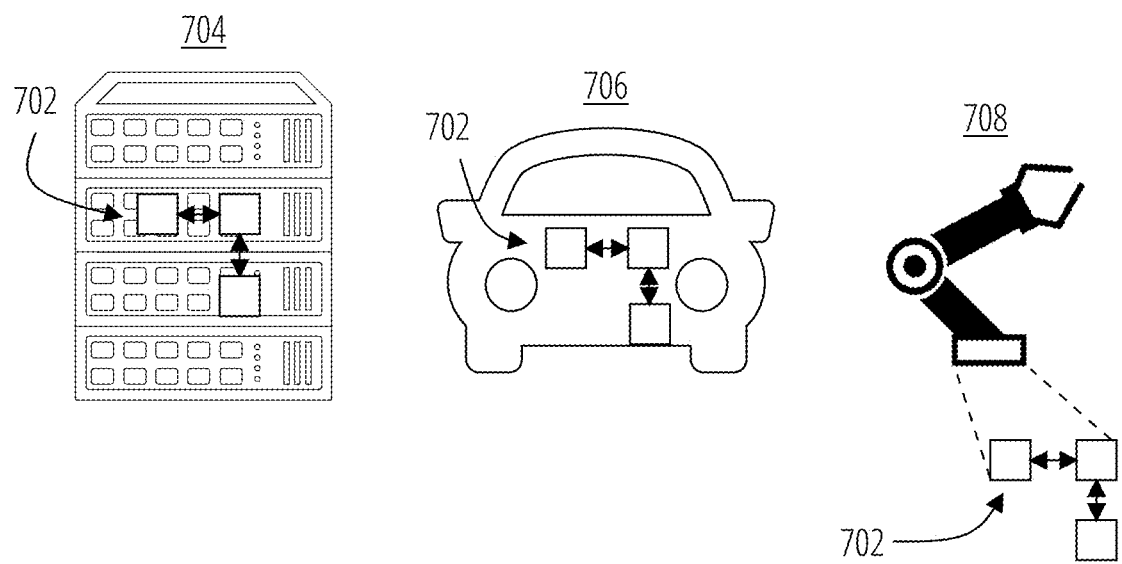
FIG. 7 depicts exemplary scenarios for use of an SBD transceiver 702 in accordance with some embodiments.

FIG. 7 depicts exemplary scenarios for use of an SBD transceiver 702 in accordance with some embodiments. An SBD transceiver 702 may be utilized in a computing system 704, a vehicle 706, and a robot 708, to name just a few examples. The SBD transceiver 702 may be configured to operate in bi-directional or uni-direction modes, for example.

LISTING OF DRAWING ELEMENTS 102 transmitter
104 receiver
106 communication channel
108 hybrid circuit
110 eye diagrams
202 replica-based SBD hybrid circuit
204 R-gm-based hybrid circuit
206 replica driver
208 subtraction circuit
210 transmit driver
302 replica driver
304 transmit driver
306 trans-impedance amplifier
308 trans-impedance amplifier
310 SSB tri-impedance network
402 transistor structure
404 termination resistor
502 pre-driver stage
504 serializer
506 main transmit driver
508 replica driver
510 driver and hybrid stage
512 configurable delay
514 configurable delay
516 pass gate
518 hybrid resistor network
520 receiver trans-impedance amplifier stage
522 receiver delay stage
524 deserializer
702 SBD transceiver
704 computing system
706 vehicle
708 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to"

perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A simultaneous bi-directional (SBD) transceiver comprising:
   a main transmit driver;
   a replica transmit driver;
   a series-series-bridged (SSB) tri-impedance network; and
   wherein a ratio of sizes for the main transmit driver and the replica transmit driver is configured such that the SSB tri-impedance network distinguishes simultaneously transmitted and received signals at an input to a receiver amplifier.

2. The SBD transceiver of claim 1, wherein the replica transmit driver is configured to receive an inverted form of a signal received by the main transmit driver.

3. The SBD transceiver of claim 1, wherein the SSB tri-impedance network comprises three discrete resistors.

4. The SBD transceiver of claim 1, wherein the receiver amplifier comprises a trans-impedance amplifier.

5. The SBD transceiver of claim 1, wherein the main transmit driver comprises header and footer trimming transistors.

6. The SBD transceiver of claim 1, wherein the replica transmit driver comprises header and footer trimming transistors.

7. A simultaneous bi-directional (SBD) transceiver comprising:
   a driver stage;
   a pre-driver stage; and
   wherein the pre-driver stage comprises parallel delay paths for a main transmit driver and a replica transmit driver, a delay of each of the delay paths being independently configurable; and
   the driver stage comprising a series-series-bridged (SSB) tri-impedance network.

8. The SBD transceiver of claim 7, wherein the delay path for the main transmit driver is configured to provide more precise tuning of signal delay than the delay path of the replica transmit driver.

9. The SBD transceiver of claim 7, wherein the replica transmit driver is configured to receive an inverted form of a signal received by the main transmit driver.

10. The SBD transceiver of claim 7, further comprising an R-C circuit coupled to receive signals from the replica transmit driver and the SSB tri-impedance network.

11. The SBD transceiver of claim 7, wherein a ratio of sizes for the main transmit driver and the replica transmit driver is configured to facilitate subtraction of simultaneously transmitted and received signals.

12. The SBD transceiver of claim 11, further comprising a trans-impedance amplifier configured to receive signals from the SSB tri-impedance network.

13. The SBD transceiver of claim 7, further comprising trimming transistors coupled to the main transmit driver.

14. The SBD transceiver of claim 7, further comprising trimming transistors coupled to the replica transmit driver.

15. A method of performing simultaneous bi-directional communication, the method comprising:
communicating outbound signals to a series-series-bridged (SSB) tri-impedance network via a main transmit driver and a replica transmit driver;
receiving inbound signals at an amplifier via the SSB tri-impedance network; and
independently tuning propagation delays of signals received by the main transmit driver and the replica transmit driver.

16. The method of claim 15, further comprising:
setting the SSB tri-impedance network into one of a near-ground configuration or near-supply configuration for uni-directional communication.

17. The method of claim 15, wherein the SSB tri-impedance network comprises three discrete resistors.

18. The method of claim 15, further comprising:
trimming one or more of the main transmit driver and the replica transmit driver to account for channel loading.

19. A simultaneous bi-directional (SBD) transceiver comprising:
a series-series-bridged (SSB) tri-impedance network;
a first input path to the SSB tri-impedance network through a first driver;
a second input path to the SSB tri-impedance network through a second driver; and
the first input path and the second input path comprising propagation delays that are independently configurable from one another.

20. The transceiver of claim 19, wherein the first input path is configured to provide more precise tuning of propagation delay than the second input path.

21. The transceiver of claim 19, wherein the second driver is configured to receive an inverted form of a signal received by the first driver.

22. The transceiver of claim 19, further comprising an R-C circuit coupled between the second driver and the SSB tri-impedance network.

23. The transceiver of claim 19, wherein the first driver and the second driver are relatively sized to implement subtraction of simultaneously applied signals to the SSB tri-impedance network.

24. The transceiver of claim 23, further comprising a trans-impedance amplifier configured to receive signals from the SSB tri-impedance network.

25. The transceiver of claim 19, the first driver comprising trimming transistors.

26. The transceiver of claim 19, the second driver comprising trimming transistors.

* * * * *